United States Patent
Liu et al.

(10) Patent No.: US 12,085,811 B2
(45) Date of Patent: Sep. 10, 2024

(54) DISPLAY SUBSTRATE, MANUFACTURING METHOD, DISPLAY MOTHERBOARD, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jiarong Liu, Beijing (CN); Heng Wang, Beijing (CN); Zhixiao Yao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/753,246

(22) PCT Filed: Apr. 29, 2021

(86) PCT No.: PCT/CN2021/090942
§ 371 (c)(1),
(2) Date: Nov. 3, 2022

(87) PCT Pub. No.: WO2022/226883
PCT Pub. Date: Nov. 3, 2022

(65) Prior Publication Data
US 2024/0111191 A1  Apr. 4, 2024

(51) Int. Cl.
*G02F 1/1347* (2006.01)
*G02F 1/1333* (2006.01)
(Continued)

(52) U.S. Cl.
CPC ...... *G02F 1/1339* (2013.01); *G02F 1/133351* (2013.01); *G02F 1/1368* (2013.01); *H01L 27/124* (2013.01); *H01L 27/1259* (2013.01)

(58) Field of Classification Search
CPC ..................................... G02F 1/1347
See application file for complete search history.

(56) References Cited

U.S. PATENT DOCUMENTS

2018/0173032 A1* 6/2018 Suga ................ G02F 1/136286
2019/0033645 A1* 1/2019 Zhang ............... G02F 1/133514
(Continued)

FOREIGN PATENT DOCUMENTS

CN  101630085 A  1/2010
CN  101916007 A  12/2010
(Continued)

*Primary Examiner* — Sang V Nguyen
(74) *Attorney, Agent, or Firm* — McCoy Russell LLP

(57) ABSTRACT

The present disclosure provides a display substrate, including an array substrate, a color filter substrate, and a liquid crystal layer and a sealant arranged therebetween. A sealing cavity for receiving the liquid crystal layer is defined by the sealant, the array substrate and the color filter substrate. The display substrate is provided with a bonding side surface bonded to a chip on film, the sealant at least includes a first portion including a first side surface and a second side surface flush with the bonding side surface. The array substrate includes a display region and a non-display region surrounding the display region. A bonding pin is provided in the non-display region, extends to a side surface of the display substrate, and is exposed to the outside. The present disclosure further provides a method for manufacturing the display substrate, a display motherboard, and a display device.

17 Claims, 3 Drawing Sheets

(51) Int. Cl.
  *G02F 1/1339* (2006.01)
  *G02F 1/1368* (2006.01)
  *H01L 27/12* (2006.01)

(56) References Cited

U.S. PATENT DOCUMENTS

2021/0356781 A1* 11/2021 Wang ................ G02F 1/133305
2021/0405482 A1   12/2021 Ye et al.

FOREIGN PATENT DOCUMENTS

| | | | | |
|---|---|---|---|---|
| CN | 105549272 | * | 5/2016 | ........... G02F 1/1339 |
| CN | 105549272 A | | 5/2016 | |
| CN | 107247355 A | | 10/2017 | |
| CN | 108153070 A | | 6/2018 | |
| CN | 110007534 A | | 7/2019 | |
| CN | 110568681 A | | 12/2019 | |
| CN | 110764323 A | | 2/2020 | |
| CN | 110888276 A | | 3/2020 | |
| CN | 110967881 A | | 4/2020 | |
| CN | 110989234 A | | 4/2020 | |
| CN | 111352270 A | | 6/2020 | |
| CN | 111638607 A | | 9/2020 | |
| CN | 110299121 | * | 2/2022 | ........... G02F 1/1362 |
| KR | 20060112948 | * | 11/2006 | ......... G02F 1/13394 |
| KR | 20060112948 A | | 11/2006 | |

* cited by examiner

DISPLAY SUBSTRATE, MANUFACTURING METHOD, DISPLAY MOTHERBOARD, AND DISPLAY DEVICE

CROSS REFERENCE TO RELATED APPLICATION

The present application is a U.S. National Phase of International Application No. PCT/CN2021/090942 entitled "DISPLAY SUBSTRATE, MANUFACTURING METHOD, DISPLAY MOTHERBOARD, AND DISPLAY DEVICE," and filed on Apr. 29, 2021. The entire contents of the above-listed application are hereby incorporated by reference for all purposes.

TECHNICAL FIELD

The present disclosure relates to the manufacture of a liquid crystal product, in particular to a display substrate, a manufacturing method thereof, a display motherboard and a display device.

BACKGROUND

Spliced screen products are a popular segment in the display industry in recent years. Display panels each with a narrow bezel are spliced to obtain an oversized display panel, but an image is displayed invalidly at a joint between two display panels, so an overall display effect is adversely affected. In order to achieve an excellent display effect, the bezel of the display panel becomes narrower and narrower. In the related art, the display panels are bonded at front faces, and the bezel has a width of about 1 mm-2 mm, which has already reached a process limit. In this case, a side bonding process has been proposed, so as to reduce a size of the bezel. In the side bonding technology, at first a glass side surface needs to be vertically ground first. At this time, a metal lead may be damaged, the stability of a contact resistance of the metal lead may decrease, and defects may be easily caused due to a change in external temperature and humidity.

SUMMARY

An object of the present disclosure is to provide a display substrate, a manufacturing method thereof, a display motherboard and a display device, so as to solve the problem in the side bonding technology where the metal lead on the display substrate is curled and damaged when a side surface of the display substrate is ground.

In one aspect, the present disclosure provides in some embodiments a display substrate, including an array substrate and a color filter substrate arranged opposite to each other. A liquid crystal layer and a sealant are arranged between the array substrate and the color filter substrate, and a sealing cavity for receiving the liquid crystal layer is defined by the sealant, the array substrate and the color filter substrate. The display substrate is provided with a bonding side surface bonded to a chip on film, the sealant at least includes a first portion close to the bonding side surface, the first portion includes a first side surface in contact with the liquid crystal layer and a second side surface arranged opposite to the first side surface, and the second side surface is flush with the bonding side surface of the display substrate. The array substrate includes a display region and a non-display region surrounding the display region. A bonding pin is provided in the non-display region, extends to a side surface of the display substrate, and is exposed to the outside.

In a possible embodiment of the present disclosure, the sealant includes a first sub-sealant surrounding the liquid crystal layer and at least one second sub-sealant surrounding the first sub-sealant, and the second sub-sealant close to the first sub-sealant is spaced apart from the first sub-sealant.

In a possible embodiment of the present disclosure, the sealant includes at least two second sub-sealants spaced part from each other.

In a possible embodiment of the present disclosure, the first sub-sealant and the second sub-sealant are formed through a same coating process.

In a possible embodiment of the present disclosure, the first portion includes a third sub-sealant in contact with the liquid crystal layer and at least one fourth sub-sealant arranged at a side of the third sub-sealant away from the liquid crystal layer, the fourth sub-sealant close to the third sub-sealant is spaced apart from the third sub-sealant, and the fourth sub-sealant is of a strip-like structure parallel to the bonding side surface and the array substrate.

In a possible embodiment of the present disclosure, the first portion includes at least two fourth sub-sealants spaced apart from each other.

In a possible embodiment of the present disclosure, the array substrate includes a base substrate and a thin film transistor array arranged on the base substrate, the thin film transistor array includes a gate metal layer, a gate insulation layer, a source/drain metal layer and an insulation protection layer laminated one on another in a direction away from the base substrate, and the bonding pin is arranged at a same layer as the gate metal layer.

In a possible embodiment of the present disclosure, the array substrate includes a base substrate and a thin film transistor array arranged on the base substrate, and the thin film transistor array includes a gate metal layer, a gate insulation layer, a source/drain metal layer and an insulation protection layer laminated one on another in a direction away from the base substrate. The bonding pin includes a first lead and a second lead, the first lead is arranged at a same layer as the gate metal layer, the second lead is arranged at a same layer as the source/drain metal layer, the array substrate further includes a transparent electrode layer arranged in the non-display region, and the first lead is coupled to the second lead by the transparent electrode layer through a via hole.

In another aspect, the present disclosure provides in some embodiments a display motherboard which is cut along a cutting line to form a plurality of the above-mentioned display substrates. The display motherboard further includes a sealing adhesive layer arranged outside the cutting line and formed integrally with the sealant.

In yet another aspect, the present disclosure provides in some embodiments a method for manufacturing a display substrate, including: providing the above-mentioned display motherboard; cutting the display motherboard along the cutting line to form a plurality of secondary substrates; grinding a side surface of each secondary substrate to form the bonding side surface, and exposing the bonding pin; transferring a metal lead at the bonding side surface in such a manner that the metal lead is coupled to the bonding pin; and enabling a chip on film to be coupled to the metal lead through a conductive adhesive layer to form the above-mentioned display substrate.

In still yet another aspect, the present disclosure provides in some embodiments a display device, including: the above-mentioned display substrate; a metal lead arranged at a side surface of the above-mentioned display substrate and coupled to the bonding pin; a chip on film coupled to the metal lead through a conductive adhesive layer; and a circuit board bonded to the chip on film.

In a possible embodiment of the present disclosure, the metal lead extends to the color filter substrate in a direction perpendicular to the array substrate.

According to the embodiments of the present disclosure, the sealant covers a to-be-ground portion, so as to protect the bonding pin on the array substrate during polishing, thereby to prevent the bonding pin from being curled and damaged.

DETAILED DESCRIPTION

Figure 1:
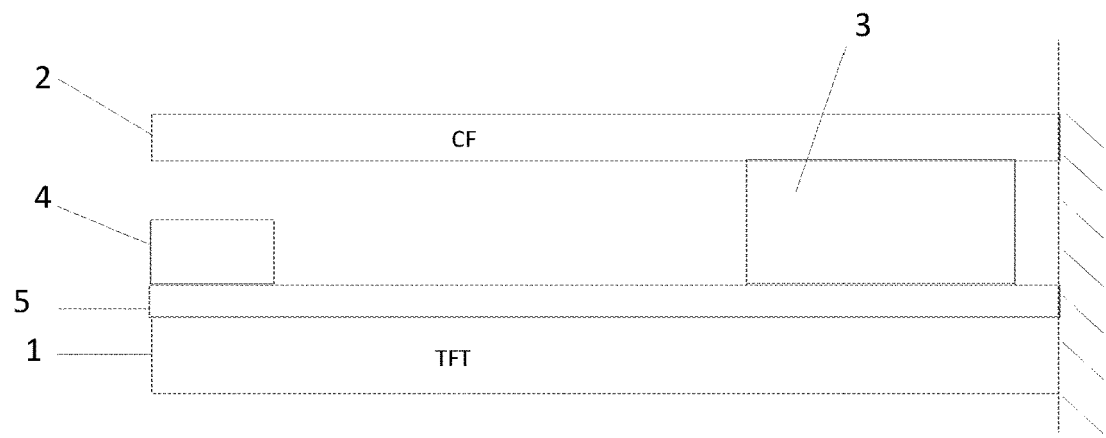
FIG. 1 is a schematic view showing a conventional display substrate.
Figure 2:
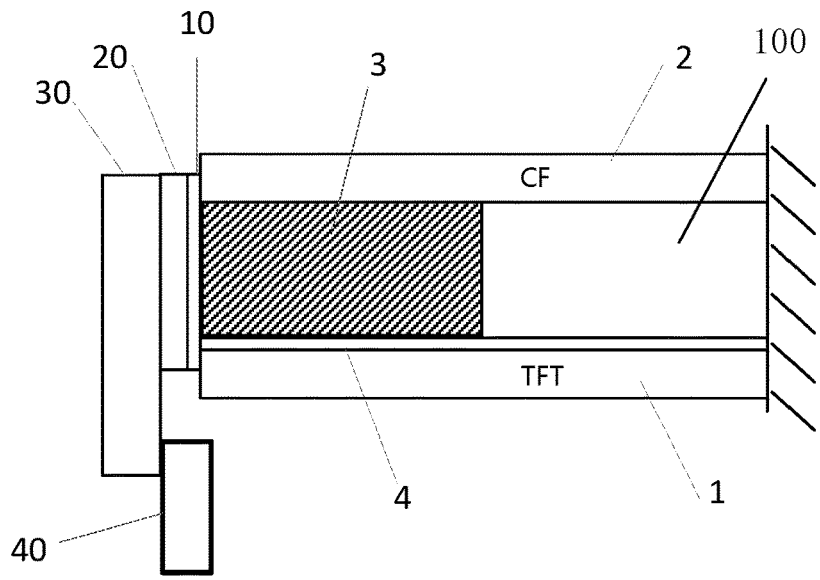
FIG. 2 is a schematic view showing a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position. In addition, such words as "first", "second" and "third" may be merely used to differentiate different components rather than to indicate or imply any importance.

In a side bonding technology, at first a glass side surface (including a side surface of an array substrate 1 and a side surface of a color filter substrate 2) needs to be vertically ground. During the grinding, a metal lead (i.e., a bonding pin) 5 of a display panel may be damaged. After the bonding, the stability of a contact resistance of the metal lead 5 may decrease, and detects may occur due to the thermal expansion and contraction caused by external temperature and humidity. In a conventional display panel, an organic film 4 is arranged on the metal lead 5 as a protection layer for the metal lead 5, as shown in FIG. 1. However, when a thickness of the organic film 4 exceeds a thickness of a display region, excessive support, and thereby display uniformity, may occur. The organic film 4 may not completely fill in a gap between the array substrate 1 and the color filter substrate 2, so its protection effect is weak.

As shown in FIG. 2 to FIG. 8, in order to solve the above problems, the present disclosure provides in some embodiments a display substrate, including an array substrate 1 and a color filter substrate 2 arranged opposite to each other. A liquid crystal layer 100 and a sealant 3 are arranged between the array substrate 1 and the color filter substrate 2, and a sealing cavity for receiving the liquid crystal layer 100 is defined by the sealant 3, the array substrate 1 and the color filter substrate 2. The display substrate is provided with a bonding side surface bonded to a chip on film 30, the sealant 3 at least includes a first portion 301 close to the bonding side surface, the first portion 301 includes a first side surface in contact with the liquid crystal layer and a second side surface arranged opposite to the first side surface, and the second side surface is flush with the bonding side surface of the display substrate. The array substrate 1 includes a display region and a non-display region surrounding the display region. A bonding pin 4 is arranged in the non-display region, extends to a side surface of the display substrate, and is exposed to the outside.

According to the embodiments of the present disclosure, at least a part of the existing sealant 3 extends to the bonding side surface of the display substrate, that is, the second side surface of the sealant 3 is flush with the bonding side surface of the display substrate. As compared with the related art where the organic film is arranged independently, in the embodiments of the present disclosure, the bonding pin 4 is protected by the sealant 3, and the sealant 3 is completely filled in a gap between the array substrate 1 and the color filter substrate 2, so it is able to effectively protect the bonding pin 4.

The sealant 3 may have various structural forms, as long as the bonding pin 4 is protected by the sealant 3 and meanwhile the sealing cavity is defined by the sealant 3, the array substrate 1 and the color filter substrate 2.

Figure 3:
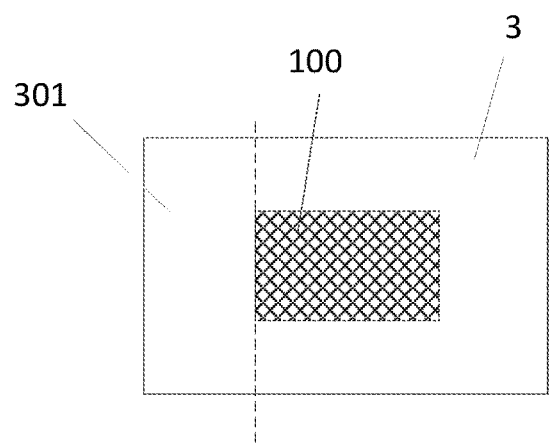
FIG. 3 is another schematic view showing the display substrate according to one embodiment of the present disclosure.
Figure 4:
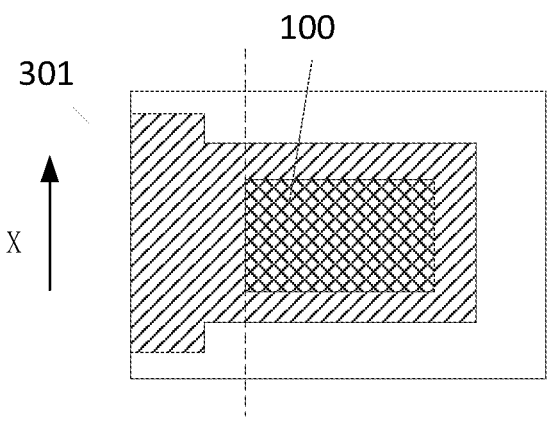
FIG. 4 is yet another schematic view showing the display substrate according to one embodiment of the present disclosure.
Figure 6:
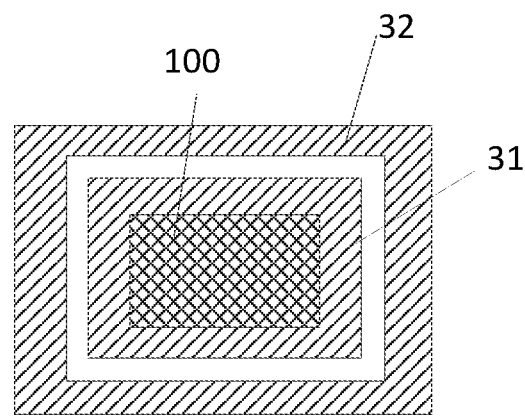
FIG. 6 is still yet another schematic view showing the display substrate according to one embodiment of the present disclosure.
Figure 7:
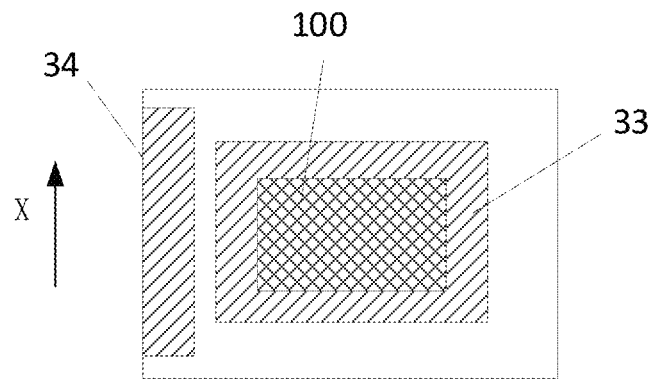
FIG. 7 is still yet another schematic view showing the display substrate according to one embodiment of the present disclosure.

The sealant 3 may be an integral structure, as shown in FIG. 3 and FIG. 4, or may be a structure having a pattern (i.e., the sealant 3 includes a hollowed-out portion), as shown in FIG. 6 and FIG. 7. The sealant 3 may completely cover the non-display region of the array substrate, as shown in FIG. 3, or the sealant 3 may also extends from a side close to the bonding side surface to the bonding side surface to form the first portion 301, as shown in FIG. 4.

As shown in FIG. 4, it should be appreciated that, in a direction parallel to the bonding side surface and the array substrate 1 (direction X in FIG. 4), a length of the first portion 301 is, but not limited to, smaller than a length of a corresponding side of the array substrate 1. For example, in the direction parallel to the bonding side surface and the array substrate 1 (direction X in FIG. 4), the length of the first portion 301 may be equal to the length of the corresponding side of the array substrate 1, as long as a size of the first portion 301 meets the requirement on the connection between the first portion 301 and the chip on film.

Figure 5:
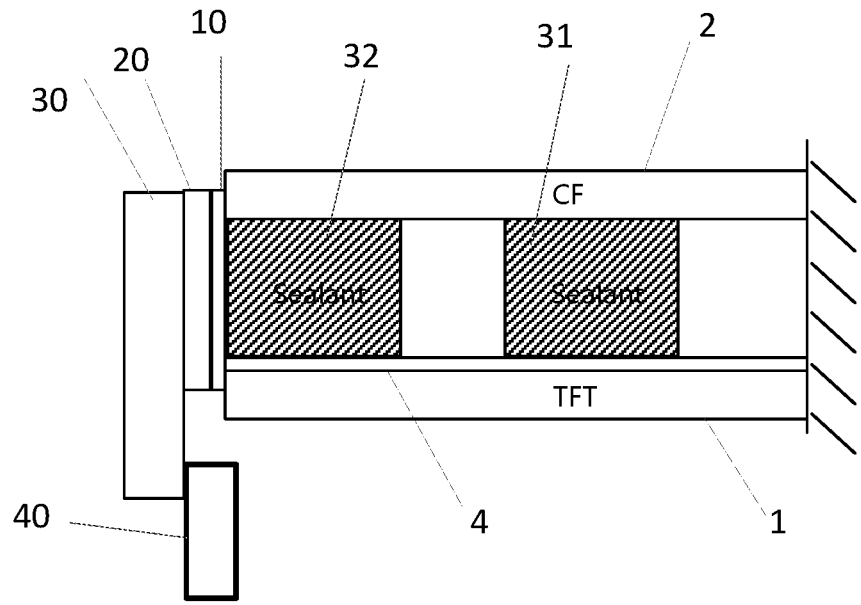
FIG. 5 is still yet another schematic view showing the display substrate according to one embodiment of the present disclosure.

As shown in FIG. 5 and FIG. 6, in the embodiments of the present disclosure, the sealant 3 includes a first sub-sealant 31 surrounding the liquid crystal layer 100 and at least one second sub-sealant 32 surrounding the first sub-sealant 31, and the second sub-sealant 32 close to the first sub-sealant 31 is spaced apart from the first sub-sealant 31.

The second sub-sealant 32 away from the first sub-sealant 31 is provided with the second side surface. Through the second sub-sealants 32 arranged at intervals, it is able to reduce the manufacture cost.

The quantity of the second sub-sealants 32 may be set according to the practical needs. In the embodiments of the present disclosure, when the sealant includes at least two second sub-sealants 32, the at least two second sub-sealants 32 are arranged at intervals.

In the embodiments of the present disclosure, the first sub-sealant 31 and the second sub-sealant 32 are formed through a same coating process.

When the first sub-sealant 31 and the second sub-sealant 32 are formed through a single coating process, it is able to provide the first sub-sealant 31 and the second sub-sealant 32 with a same thickness, i.e., to enable a surface of the first sub-sealant 31 in contact with the color filter substrate 2 and a surface of the second sub-sealant 32 in contact with the color filter substrate 2 to be located on a same plane.

As shown in FIG. 5 and FIG. 7, in the embodiments of the present disclosure, the first portion 301 includes a third sub-sealant 33 in contact with the liquid crystal layer 100 and at least one fourth sub-sealant 34 arranged at a side of the third sub-sealant 33 away from the liquid crystal layer 100, the fourth sub-sealant close to the third sub-sealant is spaced apart from the third sub-sealant, and the fourth sub-sealant 34 is of a strip-like structure extending in a direction parallel to the bonding side surface and the array substrate 1 (direction X in FIG. 7).

Merely the first portion 301 corresponding to the bonding side surface is provided with the second side surface, and there is a gap between the other portion of the sealant 3 adjacent to or opposite to the first portion 301 and the corresponding side surface of the display substrate. That is, a side surface of the other portion away from the liquid crystal layer is arranged in the array substrate 1 or the color filter substrate 2, so as to reduce the manufacture cost.

It should be appreciated that, a length of the fourth sub-sealant 34 in direction X may be set according to the practical need.

In the embodiments of the present disclosure, when the first portion includes at least two fourth sub-sealants, the at least two fourth sub-sealants 32 are spaced apart from each other.

In the embodiments of the present disclosure, the array substrate 1 includes a base substrate and a thin film transistor array arranged on the base substrate, the thin film transistor array includes a gate metal layer, a gate insulation layer 12, a source/drain metal layer and an insulation protection layer 14 laminated one on another in a direction away from the base substrate, and the bonding pin 4 is arranged at a same layer as the gate metal layer.

Figure 8:
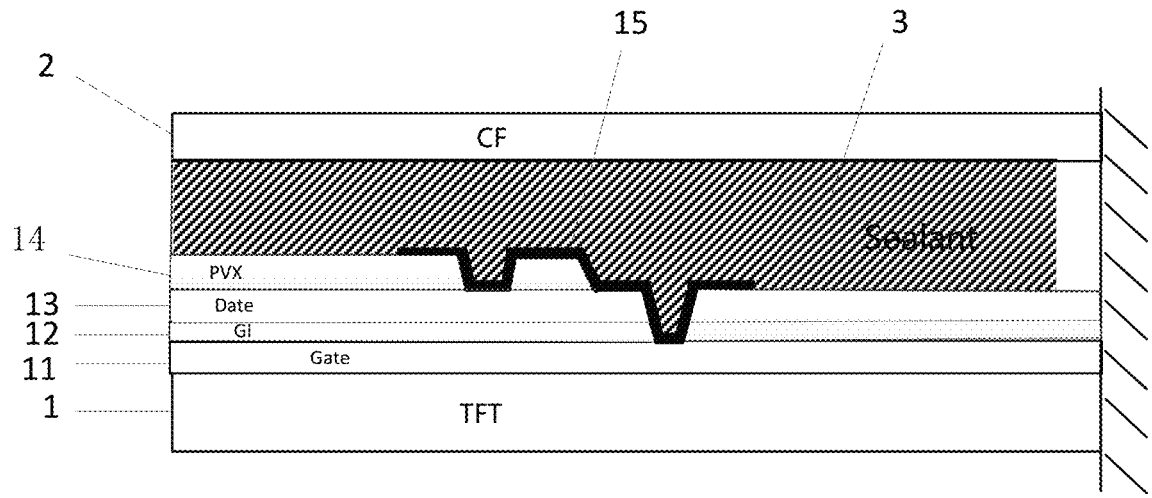
FIG. 8 is still yet another schematic view showing the display substrate according to one embodiment of the present disclosure.

As shown in FIG. 8, in the embodiments of the present disclosure, the array substrate 1 includes a base substrate and a thin film transistor array arranged on the base substrate, and the thin film transistor array includes a metal layer, a gate insulation layer 12, a source/drain metal layer and a insulation protection layer 14 laminated one on another in a direction away from the base substrate. The bonding pin 4 includes a first lead 11 and a second lead 13, the first lead 11 is arranged at a same layer as the gate metal layer, and the second lead 13 is arranged at a same layer as the source/drain metal layer. The array substrate 1 further includes a transparent electrode layer arranged in the non-display region, and the first lead 11 is coupled to the second lead 13 by the transparent electrode layer 15 through a via-hole.

Through the first lead 11 and the second lead 13, it is able to increase a coupling area between the bonding pin 4 and the chip on film 30, thereby to improve the coupling stability.

Figure 9:
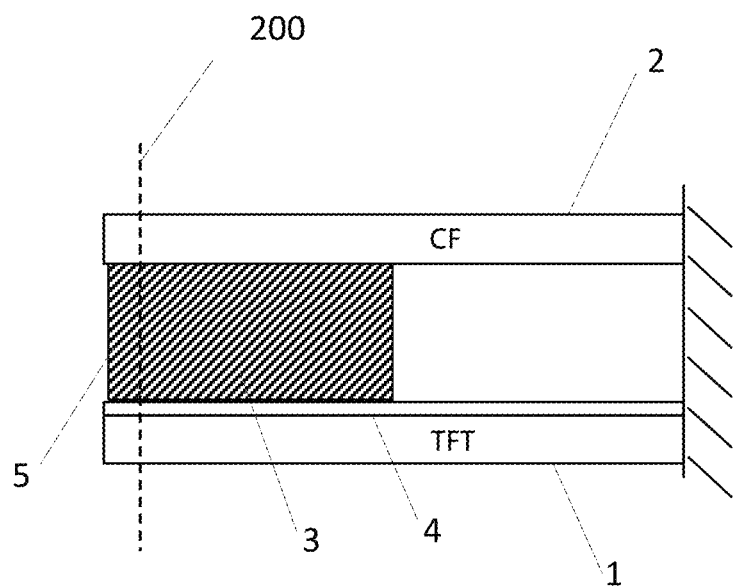
FIG. 9 is a partially schematic view showing a display motherboard according to one embodiment of the present disclosure.

As shown in FIG. 9, the present disclosure further provides in some embodiments a display motherboard which is cut along a cutting line 200 to form a plurality of the above-mentioned display substrates. The display motherboard further includes a sealing adhesive layer 5 arranged outside the cutting line 200 and formed integrally with the sealant 3.

The sealing adhesive layer 5 is formed integrally with the sealant 3, i.e., the sealing adhesive layer 5 is formed through extending the sealant 3 outward. In this way, after the display motherboard has been cut along the cutting line 200, the second side surface of the sealant 3 is flush with the bonding side surface of the display substrate, so it is able to effectively protect the bonding pin 4.

The present disclosure further provides in some embodiments a method for manufacturing a display substrate, including: providing the above-mentioned display motherboard; cutting the display motherboard along the cutting line 200 to form a plurality of secondary substrates; grinding a side surface of the secondary substrate to form the bonding side surface, and exposing the bonding pin 4; transferring a metal lead 10 at the bonding side surface in such a manner that the metal lead 10 is coupled to the bonding pin 4; and enabling a chip on film 30 to be coupled to the metal lead 10 through a conductive adhesive layer 20 to form the above-mentioned display substrate.

The present disclosure further provides in some embodiments a display device, including the above-mentioned display substrate. The display device further includes: a metal lead 10 arranged at a side of the above-mentioned display substrate and coupled to the bonding pin 4; a chip on film 30 coupled to the metal lead 10 through a conductive adhesive layer 20; and a circuit board 40 bonded to the chip on film 30.

In the embodiments of the present disclosure, the metal lead 10 extends to the color filter substrate 2 in a direction perpendicular to the array substrate 1.

When the metal lead 10 extends to the color filter substrate 2, it is able to increase a coupling area between the metal lead 10 and the bonding side surface of the display substrate, thereby to improve the coupling strength.

The display device may be any product or member having a display function, such as a liquid crystal television, a liquid crystal display, a digital photo frame, a mobile phone and a tablet computer. The display device further includes a flexible circuit board, a printed circuit board and a back plate.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising an array substrate and a color filter substrate arranged opposite to each other, wherein a liquid crystal layer and a sealant are arranged between the array substrate and the color filter substrate, and a sealing cavity for receiving the liquid crystal layer is defined by the sealant, the array substrate and the color filter substrate;

the display substrate is provided with a bonding side surface bonded to a chip on film, the sealant at least comprises a first portion close to the bonding side surface, the first portion comprises a first side surface in contact with the liquid crystal layer and a second side surface arranged opposite to the first side surface, and the second side surface is flush with the bonding side surface of the display substrate;

the array substrate comprises a display region and a non-display region surrounding the display region; and a bonding pin is provided in the non-display region, extends to a side surface of the display substrate, and is exposed to the outside;

wherein the array substrate comprises a base substrate and a thin film transistor array arranged on the base substrate, and the thin film transistor array comprises a gate metal layer, a gate insulation layer, a source/drain metal layer and an insulation protection layer laminated one on another in a direction away from the base substrate, wherein the bonding pin comprises a first lead and a second lead, the first lead is arranged at a same layer as the gate metal layer, the second lead is arranged at a same layer as the source/drain metal layer, the array substrate further comprises a transparent electrode layer arranged in the non-display region, and the first lead is coupled to the second lead by the transparent electrode layer through a via hole.

2. The display substrate according to claim 1, wherein the sealant comprises a first sub-sealant surrounding the liquid crystal layer and at least one second sub-sealant surrounding the first sub-sealant, and the second sub-sealant close to the first sub-sealant is spaced apart from the first sub-sealant.

3. The display substrate according to claim 2, wherein the sealant comprises at least two second sub-sealants spaced part from each other.

4. The display substrate according to claim 2, wherein the first sub-sealant and the second sub-sealant are formed through a same coating process.

5. The display substrate according to claim 1, wherein the first portion comprises a third sub-sealant in contact with the liquid crystal layer and at least one fourth sub-sealant arranged at a side of the third sub-sealant away from the liquid crystal layer, the fourth sub-sealant close to the third sub-sealant is spaced apart from the third sub-sealant, and the fourth sub-sealant is of a strip-like structure parallel to the bonding side surface and the array substrate.

6. The display substrate according to claim 5, wherein the first portion comprises at least two fourth sub-sealants spaced apart from each other.

7. A display motherboard which is cut along a cutting line to form a plurality of display substrates according to claim 1, wherein the display motherboard further comprises a sealing adhesive layer arranged outside the cutting line and formed integrally with the sealant.

8. A method for manufacturing a display substrate, wherein the display substrate comprises an array substrate and a color filter substrate arranged opposite to each other, a liquid crystal layer and a sealant are arranged between the array substrate and the color filter substrate, and a sealing cavity for receiving the liquid crystal layer is defined by the sealant, the array substrate and the color filter substrate;

the display substrate is provided with a bonding side surface bonded to a chip on film, the sealant at least comprises a first portion close to the bonding side surface, the first portion comprises a first side surface in contact with the liquid crystal layer and a second side surface arranged opposite to the first side surface, and the second side surface is flush with the bonding side surface of the display substrate;

the array substrate comprises a display region and a non-display region surrounding the display region;

a bonding pin is provided in the non-display region, extends to a side surface of the display substrate, and is exposed to the outside, wherein the method comprises:
providing a display motherboard, the display motherboard being cut along a cutting line to form a plurality of display substrates, the display motherboard further comprising a sealing adhesive layer arranged outside the cutting line and formed integrally with the sealant;

cutting the display motherboard along the cutting line to form a plurality of secondary substrates;

grinding a side surface of each secondary substrate to form the bonding side surface, and exposing the bonding pin;

transferring a metal lead at the bonding side surface in such a manner that the metal lead is coupled to the bonding pin; and enabling a chip on film to be coupled to the metal lead through a conductive adhesive layer to form the display substrate.

9. A display device, comprising a display substrate, wherein the display substrate comprises an array substrate and a color filter substrate arranged opposite to each other, wherein a liquid crystal layer and a sealant are arranged between the array substrate and the color filter substrate, and a sealing cavity for receiving the liquid crystal layer is defined by the sealant, the array substrate and the color filter substrate;

the display substrate is provided with a bonding side surface bonded to a chip on film, the sealant at least comprises a first portion close to the bonding side surface, the first portion comprises a first side surface in contact with the liquid crystal layer and a second side surface arranged opposite to the first side surface, and the second side surface is flush with the bonding side surface of the display substrate;

the array substrate comprises a display region and a non-display region surrounding the display region; and a bonding pin is provided in the non-display region, extends to a side surface of the display substrate, and is exposed to the outside;

wherein the display device further comprises:
a metal lead arranged at a side surface of the display substrate and coupled to the bonding pin;
a chip on film coupled to the metal lead through a conductive adhesive layer; and
a circuit board bonded to the chip on film.

10. The display device according to claim 9, wherein the metal lead extends to the color filter substrate in a direction perpendicular to the array substrate.

11. The display device according to claim 9, wherein the sealant comprises a first sub-sealant surrounding the liquid crystal layer and at least one second sub-sealant surrounding the first sub-sealant, and the second sub-sealant close to the first sub-sealant is spaced apart from the first sub-sealant.

12. The display device according to claim 11, wherein the sealant comprises at least two second sub-sealants spaced part from each other.

13. The display device according to claim 11, wherein the first sub-sealant and the second sub-sealant are formed through a same coating process.

14. The display device according to claim 9, wherein the first portion comprises a third sub-sealant in contact with the liquid crystal layer and at least one fourth sub-sealant arranged at a side of the third sub-sealant away from the liquid crystal layer, the fourth sub-sealant close to the third sub-sealant is spaced apart from the third sub-sealant, and the fourth sub-sealant is of a strip-like structure parallel to the bonding side surface and the array substrate.

15. The display device according to claim 14, wherein the first portion comprises at least two fourth sub-sealants spaced apart from each other.

16. The display device according to claim 9, wherein the array substrate comprises a base substrate and a thin film transistor array arranged on the base substrate, the thin film transistor array comprises a gate metal layer, a gate insulation layer, a source/drain metal layer and an insulation protection layer laminated one on another in a direction away from the base substrate, and the bonding pin is arranged at a same layer as the gate metal layer.

17. The display device according to claim 9, wherein the array substrate comprises a base substrate and a thin film transistor array arranged on the base substrate, and the thin film transistor array comprises a gate metal layer, a gate insulation layer, a source/drain metal layer and an insulation protection layer laminated one on another in a direction away from the base substrate, wherein the bonding pin comprises a first lead and a second lead, the first lead is arranged at a same layer as the gate metal layer, the second lead is arranged at a same layer as the source/drain metal layer, the array substrate further comprises a transparent electrode layer arranged in the non-display region, and the first lead is coupled to the second lead by the transparent electrode layer through a via hole.

\* \* \* \* \*